United States Patent
Koike

(10) Patent No.: US 7,057,450 B2
(45) Date of Patent: Jun. 6, 2006

(54) NOISE FILTER FOR AN INTEGRATED CIRCUIT

(75) Inventor: Hideharu Koike, Yokohama (JP)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/630,983

(22) Filed: Jul. 30, 2003

(65) Prior Publication Data
US 2005/0024130 A1  Feb. 3, 2005

(51) Int. Cl.
H04B 1/10 (2006.01)

(52) U.S. Cl. .................. 327/552; 327/311; 327/318

(58) Field of Classification Search ............. 327/551, 327/552, 309–311, 313, 318, 319, 321, 327, 327/328, 379, 180; 361/91.1, 225; 257/355–357
See application file for complete search history.

(56) References Cited

U.S. PATENT DOCUMENTS

| | | | | |
|---|---|---|---|---|
| 4,858,055 A * | 8/1989 | Okitaka | ................... | 361/56 |
| 5,097,159 A * | 3/1992 | Seki et al. | ................... | 327/263 |
| 5,132,563 A * | 7/1992 | Fujii et al. | ................... | 326/27 |
| 5,329,174 A * | 7/1994 | Chiang | ................... | 327/313 |
| 5,459,424 A * | 10/1995 | Hattori | ................... | 327/278 |
| 5,574,395 A * | 11/1996 | Kusakabe | ................... | 327/309 |
| 5,831,457 A * | 11/1998 | McClure | ................... | 327/108 |
| 5,883,423 A * | 3/1999 | Patwa et al. | ................... | 257/532 |
| 5,883,540 A * | 3/1999 | Kwon | ................... | 327/379 |
| 5,914,516 A * | 6/1999 | Konno | ................... | 257/357 |
| 6,011,420 A * | 1/2000 | Watt et al. | ................... | 327/310 |
| 6,069,515 A * | 5/2000 | Singh | ................... | 327/309 |
| 6,121,812 A * | 9/2000 | Tsukikawa | ................... | 327/280 |
| 6,121,813 A * | 9/2000 | Furuchi | ................... | 327/285 |
| 6,194,943 B1 * | 2/2001 | Yoshizaki et al. | ........... | 327/318 |
| 6,346,851 B1 * | 2/2002 | Zhang et al. | ................ | 327/558 |
| 6,353,521 B1 * | 3/2002 | Gans et al. | ................... | 361/56 |
| 6,501,319 B1 * | 12/2002 | Takata | ................... | 327/310 |
| 6,593,794 B1 * | 7/2003 | Yue et al. | ................... | 327/310 |
| 6,724,226 B1 * | 4/2004 | Kim | ................... | 327/108 |
| 6,867,629 B1 * | 3/2005 | Drost et al. | ................. | 327/270 |

* cited by examiner

*Primary Examiner*—Timothy P. Callahan
*Assistant Examiner*—Hai L. Nguyen
(74) *Attorney, Agent, or Firm*—Jianq Chyun IP Office

(57) ABSTRACT

A noise filter for an integrated circuit is proposed. The noise filter comprises a CMOS inverter and two capacitors. The input of the CMOS inverter is coupled with an input pad of the integrated circuit and the output of the CMOS inverter is coupled with an input buffer. The first capacitor is inserted between the output of the CMOS inverter and a first voltage source and the second capacitor is inserted between the output of the CMOS inverter and a second voltage source. A transfer gate may be in stead of the CMOS inverter.

8 Claims, 2 Drawing Sheets

NOISE FILTER FOR AN INTEGRATED CIRCUIT

FIELD OF THE INVENTION

The present invention is relative to a noise filter, and more particularly to prevent a LSI (Large-Scale integration) from the malfunction caused by the external EMI (Electro-Magetic Interference).

BACKGROUND OF THE INVENTION

It is known that the external Electro-Magnetic noise from a motor or a breaker causes a spike noise on the power lines and signals of the LSI will cause functional failures in the LSI.

To prevent this problem, a noise filter has been inserted between the input pad and the input gate of the input buffer as shown in FIG. 1. This noise filter consists of a resistor and capacitor. The resistor connects the input pad and the input gate of the input buffer. The capacitor is inserted between the input gate and the ground of the LSI.

If the noise pulse is applied between the input pad and the ground line, the noise pulse is absorbed by the noise filter and the noise is not detected by the input buffer.

As far as the voltage between VDD and VSS is kept the same (This condition is called the Common Mode) and the time constant of the RC network is big enough, the noise filter of the prior art can prevent the LSI from the malfunction.

However if the following conditions happen, the noise filter of the prior art is not good enough anymore.

(1) The noise filter of FIG. 1 cannot prevent the noise, in case the noise is applied between VDD and VSS (This condition is called the Normal Mode).

(2) High resistance poly-silicon is not available in the deep sub-micron LSI.

(3) The time constant cannot be made big enough when the cycle time is small, in other words the clock frequency is high.

SUMMARY OF THE INVENTION

The object of the present invention is to provide a noise filter to prevent an LSI from the mal-function caused by the external EMI.

Another object of the present invention is to provide a noise filter having a long time constant.

Another object of the present invention is to provide a noise filter that can operate in high frequency.

According to the present invention, a noise filter for an integrated circuit comprises:

a CMOS inverter having an input and an output, the input of the CMOS inverter being coupled with an input pad of the integrated circuit, the output of the CMOS inverter being coupled with an input buffer;

a first capacitor being inserted between the output of the CMOS inverter and a first voltage source; and a second capacitor being inserted between the output of the CMOS inverter and a second voltage source.

In accordance with one aspect of the present invention, the integrated circuit is a LSI.

In accordance with one aspect of the present invention, the integrated circuit is a VLSI.

In accordance with one aspect of the present invention, the input buffer is a schmitt trigger.

In accordance with one aspect of the present invention, the CMOS inverter includes a NMOS transistor and a PMOS transistor.

In accordance with one aspect of the present invention, the first voltage source is VDD and the second voltage source is VSS.

According to the present invention, a noise filter for an integrated circuit comprises:

a transition circuit having an input and an output, the input of the transition circuit being coupled with an input pad of the integrated circuit, the output of the transition circuit being coupled with an input buffer;

a first capacitor being inserted between the output of the transition circuit and a first voltage source; and a second capacitor being inserted between the output of the transition circuit and a second voltage source.

In accordance with one aspect of the present invention, the integrated circuit is a LSI.

In accordance with one aspect of the present invention, the integrated circuit is a VLSI.

In accordance with one aspect of the present invention, the transition circuit includes two transfer gates, the two transfer gates are a NMOS transistor and a PMOS transistor.

In accordance with one aspect of the present invention, the input buffer is a schmitt trigger.

In accordance with one aspect of the present invention, the first voltage source is VDD.

In accordance with one aspect of the present invention, a reference voltage of the transition circuit is VDD/2.

In accordance with one aspect of the present invention, the second voltage source is VSS.

The present invention may best be understood through the following description with reference to the accompanying drawings, in which:

DETAIL DESCRIPTION OF THE PREFERRED EMBODIMENT

Figure 1:
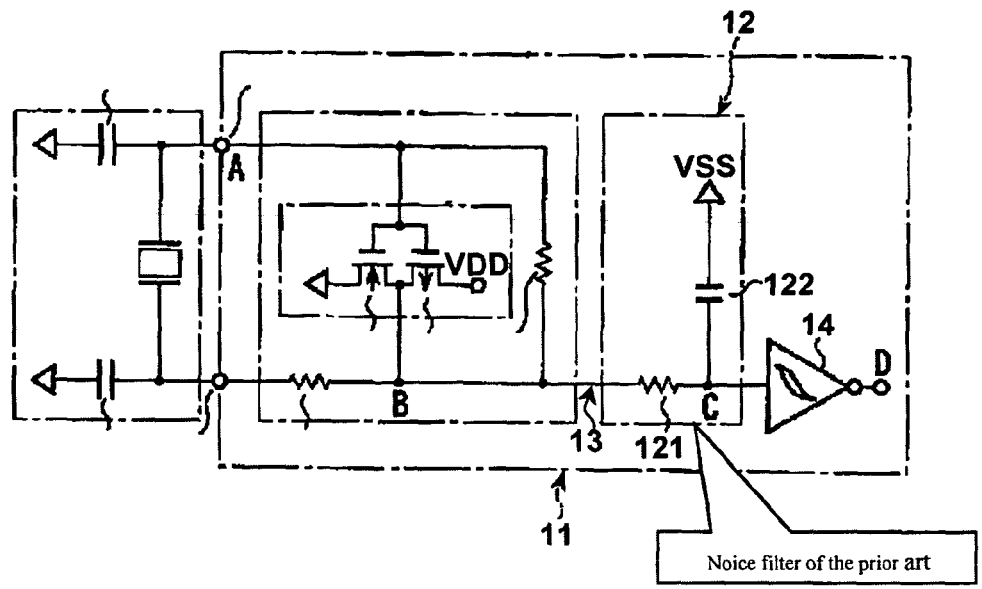
FIG. 1 shows the new noise filter of the prior art.
Figure 2:
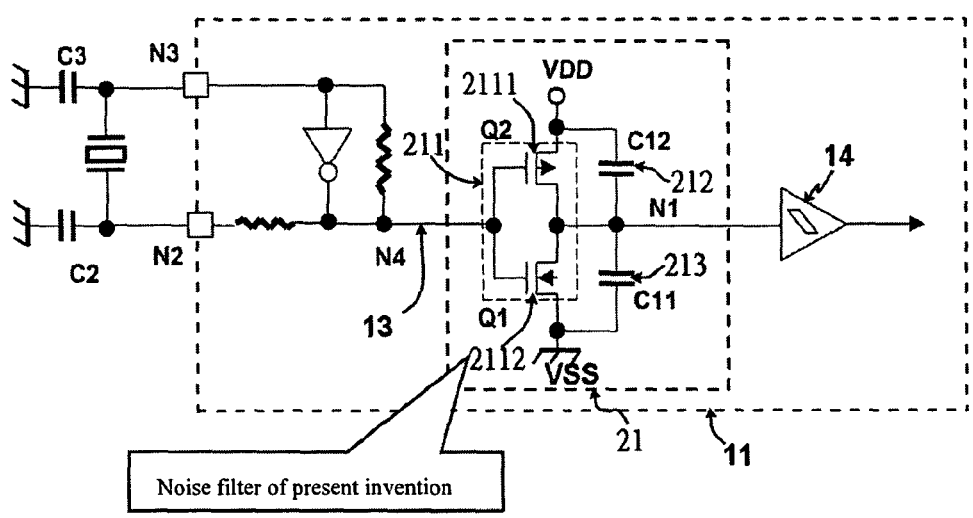
FIG. 2 shows the noise filter of the present invention.

The new noise filter 21 shown in FIG. 2 consists with one CMOS inverter 211 and two capacitors 212,213. The input gate of the inverter 211 is coupled with the input pad 13, and the output of the inverter 211 is coupled with the input gate of the input buffer 14. The first capacitors 212 is inserted between the output N1 of the inverter 211 and the VDD of the LSI and the $2^{nd}$ capacitor 213 is inserted between the output N1 of the inverter 211 and the VSS of the LSI.

By using the present invention, we can overcome the problems of the prior arts listed in the previous page as explained below.

(1) In case a noise is applied between VDD and VSS, the input voltage of the input buffer which is stored in the two capacitors, changes according to the voltage between VDD and VSS because the voltage between VDD and VSS is divided by the two capacitors 212,213. The threshold voltage of the input buffer 14 also changes according to the voltage between VDD and VSS. Assuming the threshold voltage of the input buffer is (VDD+VSS)/2, then the threshold voltage is kept (VDD+VSS)/2 even when the voltage between VDD and VSS is changed. Assuming the input voltage of the input gate is higher than the threshold voltage in the beginning, then the input voltage is kept higher than the threshold voltage even when the noise is applied between VDD and VSS and the voltage between VDD and VSS is changed. Then the noise is not detected by the input buffer.

(2) As the new noise filter of this invention does not use resistors but uses normal CMOS inverter, it does not need any high resistance materials such as high resistivity poly-silicon. Because it uses CMOS transistors instead of resistor, we can easily get high resistance and modify resistance without consuming big silicon area.

(3) In case the clock frequency is high, we could not make the time constant big enough in case of the prior art. However in the new noise filter, the current flowing through N-ch transistor of the CMOS inverter and the current flowing through P-ch transistor of the CMOS inverter compensates each other, it makes the time constant of the noise filter big enough when the input voltage is a round the threshold voltage of the input buffer. That is, the time constant of the new noise filter 21 is not the constant, but it changes according to the input voltage. The time constant is small when the voltage is close to VDD or VSS. But the time constant becomes big when the input voltage reaches around the threshold voltage of the input buffer.

Figure 3:
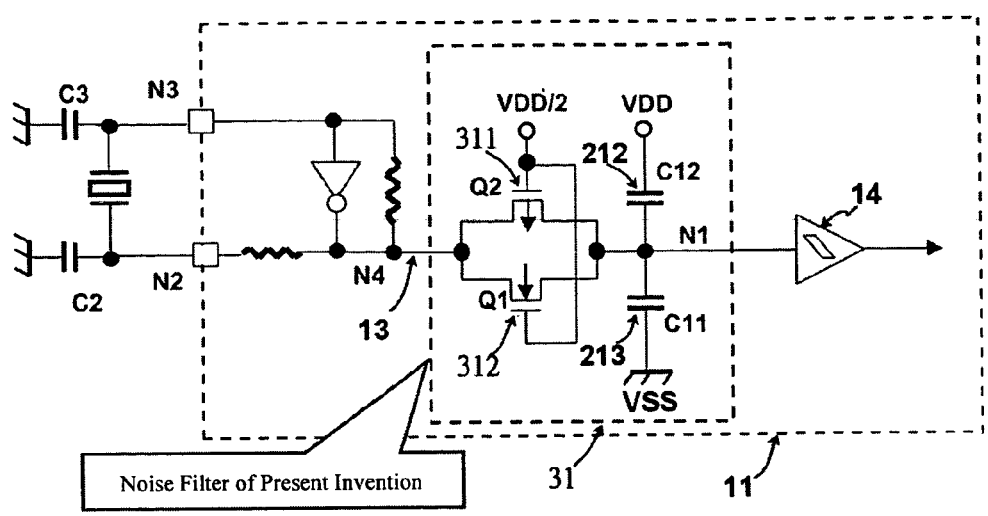
FIG. 3 shows another embodiment of the new noise filter.

Another embodiment of the present invention is shown in FIG. 3. Instead of CMOS inverter, transfer gates 311, 312 with applying the reference voltage (VDD/2) is utilized. The transfer gates 311, 312 compose a transition circuit and they are a PMOS transistor 311 and a NMOS transistor 312. When the input voltage is close to the VDD or VSS, one of the transfer gate is turned on and the resistance of the transfer gate becomes small, but when the input voltage is around the threshold voltage of the input buffer, both transfer gates 311, 312 turned off and the resistance of the transfer gate becomes infinite. The reference voltage (VDD/2) can be changed such as, VDD-1.5V to the gate of the P-ch transistor and 1.5V to the gate of the N-ch transistor.

By using this new noise filter, we can prevent the noise to affect the input buffer without sacrificing the silicon area nor the clock frequency.

By using MOS transistors as the resistors instead of passive resistors, we can save the additional process for high resistivity poly-silicon and we can easily control resistance of the noise filter without using large silicon area.

As the time constant of the new noise filter is small when the input voltage is close to VDD or VSS but it is big when the input voltage is around the threshold voltage of the input buffer, the new noise filter can protect the noise efficiently without sacrificing the signal frequency.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A noise filter for an integrated circuit comprising:
   a transition circuit having an input and an output, said input of said transition circuit being coupled with an input pad of said integrated circuit, said output of said transition circuit being coupled with an input buffer;
   a first capacitor being inserted between said output of said transition circuit and a first voltage source; and
   a second capacitor being inserted between said output of said transition circuit and a second voltage source;
   said transition circuit comprising with a Pch MOS transistor and a Nch MOS transistor;
   the source of said Pch MOS transistor and the Nch MOS transistor being coupled with the input of said transition circuit;
   the drain of said Pch MOS transistor and the Nch MOS transistor being coupled with the output of said transition circuit;
   the gate of said Pch MOS transistor being coupled with a third voltage source;
   the gate of said Nch MOS transistor being coupled with a fourth voltage source.

2. A noise filter according to claim 1, wherein said integrated circuit is a LSI.

3. A noise filter according to claim 1, wherein said integrated circuit is a VLSI.

4. A noise filter according to claim 1, wherein said transition circuit includes two transfer gates, the two transfer gates are a NMOS transistor and a PMOS transistor.

5. A noise filter according to claim 1, wherein said input buffer is a schmitt trigger.

6. A noise filter according to claim 1, wherein said first voltage source is VDD.

7. A noise filter according to claim 6, wherein the third and fourth voltage sources of said transition circuit are VDD/2.

8. A noise filter according to claim 6, wherein said second voltage source is VSS.

* * * * *